(12) United States Patent
Kasapi et al.

(10) Patent No.: US 7,616,312 B2
(45) Date of Patent: *Nov. 10, 2009

(54) APPARATUS AND METHOD FOR PROBING INTEGRATED CIRCUITS USING LASER ILLUMINATION

(75) Inventors: Steven Kasapi, San Francisco, CA (US); Kenneth Wilsher, Palo Alto, CA (US); Gary Woods, Sunnyvale, CA (US); William Lo, San Jose, CA (US); Radu Ispasoiu, Los Gatos, CA (US); Nagamani Nataraj, Cupertino, CA (US); Nina Boiadjieva, Belmont, CA (US)

(73) Assignee: DCG Systems, Inc., Fremont, CA (US)

( * ) Notice: Subject to any disclaimer, the term of this patent is extended or adjusted under 35 U.S.C. 154(b) by 11 days.

This patent is subject to a terminal disclaimer.

(21) Appl. No.: 11/169,423

(22) Filed: Jun. 29, 2005

(65) Prior Publication Data

US 2007/0002329 A1   Jan. 4, 2007

(51) Int. Cl.
 *G01B 11/00* (2006.01)
(52) U.S. Cl. ..................... 356/369
(58) Field of Classification Search ........ 356/450, 356/491, 492, 495, 364, 369
 See application file for complete search history.

(56) References Cited

U.S. PATENT DOCUMENTS

| | | | |
|---|---|---|---|
| 3,524,694 A | 8/1970 | Klein et al. | 350/177 |
| 3,711,186 A | 1/1973 | O'Connor | 350/214 |
| 3,912,378 A | 10/1975 | Goto | 350/175 |
| 4,297,032 A | 10/1981 | Temple | 356/366 |
| 4,353,618 A | 10/1982 | Hagner et al. | 350/91 |
| 4,555,767 A | 11/1985 | Case et al. | 364/563 |
| 4,615,620 A | 10/1986 | Noguchi et al. | 356/378 |
| 4,625,114 A | 11/1986 | Bosacchi et al. | 250/341 |
| 4,634,234 A | 1/1987 | Baumann | 350/414 |
| 4,680,635 A | 7/1987 | Khurana | 358/211 |
| 4,724,322 A | 2/1988 | Knowles et al. | 250/341 |
| 4,736,159 A * | 4/1988 | Shiragasawa et al. | 324/752 |
| 4,758,092 A | 7/1988 | Heinrich et al. | 356/364 |
| 4,811,090 A | 3/1989 | Khurana | 358/93 |

(Continued)

OTHER PUBLICATIONS

Weingarten et al, Picosecond Optical Sampling of GaAs Integrated Circuits, IEEE Journal of Quantum Electronics, vol. 24, No. 2, Feb. 1988, pp. 198-320.*

(Continued)

*Primary Examiner*—Samuel A Turner
(74) *Attorney, Agent, or Firm*—Nixon Peabody LLP; Joseph Bach, Esq.

(57) ABSTRACT

An apparatus and method for laser probing of a DUT at very high temporal resolution is disclosed. The system includes a CW laser source, a beam optics designed to point two orthogonally polarized beams at the same location on the DUT, optical detectors for detecting the reflected beams, collection electronics, and an oscilloscope. The beam optics defines a common-path polarization differential probing (PDP) optics. The common-path PDP optics divides the laser beam into two beams of orthogonal polarization. Due to the intrinsic asymmetry of a CMOS transistor, the interaction of the beams with the DUT result in different phase modulation in each beam. This difference can be investigated to study the response of the DUT to the stimulus signal.

55 Claims, 12 Drawing Sheets

U.S. PATENT DOCUMENTS

| | | | |
|---|---|---|---|
| 5,004,307 A | 4/1991 | Kino et al. ............... 350/1.2 |
| 5,010,945 A | 4/1991 | Burke | |
| 5,087,121 A | 2/1992 | Kakuchi et al. ............ 356/73 |
| 5,164,664 A | 11/1992 | Soelkner | |
| 5,208,648 A | 5/1993 | Batchelder et al. ......... 356/237 |
| 5,220,403 A | 6/1993 | Batchelder et al. ......... 356/345 |
| 5,247,392 A | 9/1993 | Plies ...................... 359/661 |
| 5,282,088 A | 1/1994 | Davidson ................. 359/664 |
| 5,465,043 A * | 11/1995 | Sakai ...................... 324/96 |
| 5,475,316 A | 12/1995 | Hurley et al. ............. 324/750 |
| 5,854,804 A | 12/1998 | Winer et al. | |
| 5,872,360 A | 2/1999 | Paniccia et al. | |
| 5,905,577 A * | 5/1999 | Wilsher et al. ............ 356/448 |
| 5,930,588 A | 7/1999 | Paniccia | |
| 5,940,545 A | 8/1999 | Kash et al. ............... 382/312 |
| 5,969,517 A * | 10/1999 | Rao ........................ 324/96 |
| 6,072,179 A | 6/2000 | Paniccia et al. | |
| 6,168,311 B1 | 1/2001 | Xiao et al. | |
| 6,251,706 B1 | 6/2001 | Paniccia | |
| 6,252,222 B1 * | 6/2001 | Kasapi et al. ........... 250/214 R |
| 6,252,412 B1 | 6/2001 | Talbot et al. | |
| 6,297,651 B1 * | 10/2001 | Akikuni et al. ............. 324/753 |
| 6,445,198 B1 * | 9/2002 | Akikuni et al. ............. 324/753 |
| 6,452,378 B1 * | 9/2002 | Toriyama et al. ............. 324/97 |
| 6,462,814 B1 | 10/2002 | Lo | |
| 6,509,750 B1 | 1/2003 | Talbot et al. | |
| 6,591,121 B1 | 7/2003 | Madarasz | |
| 6,594,086 B1 | 7/2003 | Pakdaman | |
| 6,605,951 B1 | 8/2003 | Cowan | |
| 6,621,275 B2 | 9/2003 | Cotton et al. ............. 324/537 |
| 6,720,588 B2 | 4/2004 | Vickers | |
| 6,778,327 B2 | 8/2004 | Pakdaman | |
| 6,788,396 B2 | 9/2004 | Stolte et al. | |
| 6,797,581 B2 | 9/2004 | Vickers | |
| 6,798,562 B2 | 9/2004 | Hakimi et al. | |
| 6,812,464 B1 | 11/2004 | Sobolewski et al. | |
| 6,836,131 B2 | 12/2004 | Cader et al. | |
| 6,897,664 B1 | 5/2005 | Bruce et al. | |
| 2004/0001255 A1 * | 1/2004 | Fratello .................. 359/484 |

OTHER PUBLICATIONS

Novel Optical Probing Technique for Flip Chip Packaged Microprocessors, Mario Paniccia et al. International Test Conference, IEEE 1998.

Optical Probing of VLSI IC's from the Silicon Backside, Travis M. Eiles, et al. Proc. 25th International Symposium for Testing and Failure Analysis, Nov. 14-18, 1999.

Waveform Acquisition from the Backside of Silicon Using Electro-Optic Probing, Mike Bruce, et al. Proc. 25th International Symposium for Testing and Failure Analysis, Nov. 14-18, 1999.

Picosecond Backside Optical Detection of Internal Signals in Flip-Chip Mounted Silicon VLSI Circuits, H.K. Heinrich et al. 3rd European Conference on Electron and Optical Beam Testing of Integrated Circuits, Sep. 9-11, 1991.

Optical Sampling of GHz Charge Density Modulation in Silicon Bipolar Junction Transistor, A. Black et al. Electronics Letters, 1987, vol. 23, No. 15, p. 783-784, 1987.

Laser Beam Backside Probing of CMOS Integrated Circuits, Steven Kasapi, et al. Microelectronics Reliability, 39 pp. 957-961, 1999.

Noninvasive Sheet Charge Density Probe for Integrated Silicon Devices, H.K Heinrich et al. Appl. Phys. Lett. 48 (16) Apr. 21, 1986.

Erratum: Noninvasive Sheet Charge Density Probe for Integrated Silicon Devices, H.K Heinrich et al. Appl. Phys. Lett. 48 1066 1986.

Noninvasive Optical Sheet Charge Density Probe for Silicon Integrated Circuits, H.K Heinrich et al. Transactions on Electron Devices, vol. Ed 33 No. 11 Nov. 1986.

Optical Detection of Charge Modulation in Silicon Integrated Circuits Using a Multimode Laser-Diode Probe, B.R. Hemenway, et al. Electron Device Letters, vol. EdL-8, No. 8 Aug. 1987.

Electrooptical Effects in Silicon, Richard A. Soref, et al. Journal of Quantum Electronics, vol. QE-23 No. 1 Jan. 1987.

Practical Optical Waveform Probing of Flip-Chip Devices, Kenneth R. Wilsher et al. ITC International Test Conference, Paper 35.1, 1999.

Integrated Circuit Waveform Probing Using Optical Phase Shift Detection, Ken Wilsher, et al. Proc. 26th International Symposium for Testing and Failure Analysis, Nov. 12-16, 2000.

Polarization Difference Probing: A New Phase Detection Scheme for Laser Voltage Probing, William Lo et al. Proc. 30th International Symposium for Testing and Failure Analysis, Nov. 14-18, 2004.

Kurt J. Weingarten, et al. "PicoSecond Optical Sampling of GaAs Integrated Circuits," IEEE Journal of Quantum Electronics. Feb. 1988, pp. 198-205, vol. 24, No. 2.

International Search Report for PCT/US07/11790 dated Feb. 14, 2008.

James S. Vickers, et al., "Time-Resolved Photon Counting System based on a Geiger-Mode InGaAs/InGaAs/InP APD and a Solid Immersion Lens," IEEE, 2003, pp. 600-601.

Nagamani Nataraj, et al., "Liquid immersion lens technology applied to laser voltage probing of 130 nm process technology devices," Journal of Vacuum Science and Technology, Technology B, Nov./Dec. 2002, pp. 3067-3070, vol. 20, No. 6, American Vacuum Society.

Ulrike Kindereit, et al., "Investigation of Laser Voltage Probing Signals in CMOS Transistors," IEEE, 45th Annual International Reliability Physics Symposium, 2007, pp. 526-533, Phoenix, AZ.

H. K. Heinrich et al. "Measurement of Real-Time Digital Signals in a Silicon Bipolar Junction Transistor Using a Noninvasive Optical Probe," Electronics Letters, Jun. 5, 1986, pp. 650-652, vol. 22, No. 12.

Ulrike Kindereit, et al., "Quantitative Investigation of Laser Beam Modulation in Electrically Active Devices as Used in Laser Voltage Probing," IEEE Transactions on Device and Materials Reliability, vol. 7, No. 1, Mar. 2007, pp. 19-30.

H. K. Heinrich, "Picosecond noninvasive optical detection of internal electrical signals in flip-chip-mounted silicon integrated circuits," IBM Journal of Research and Development, Mar./May 1990, pp. 162-172, vol. 34, No. 2/3.

H.K. Heinrich, et al., "Optical detection of multibit logic signals at internal nodes in a flip-chip mounted silicon static random-access memory integrated circuit," Journal of Vacuum Science and Technology, Technology B, Nov./Dec. 1992, pp. 3109-3111, vol. 10, No. 6, American Vacuum Society.

M. Goldstein, et al., "Heterodyn interferometer for the detection of electric and thermal signals in integrated circuits through the substrate," Review of Scientific Instruments, Oct. 1993, pp. 3009-3013, vol. 64, No. 10, American Institute of Physics.

* cited by examiner

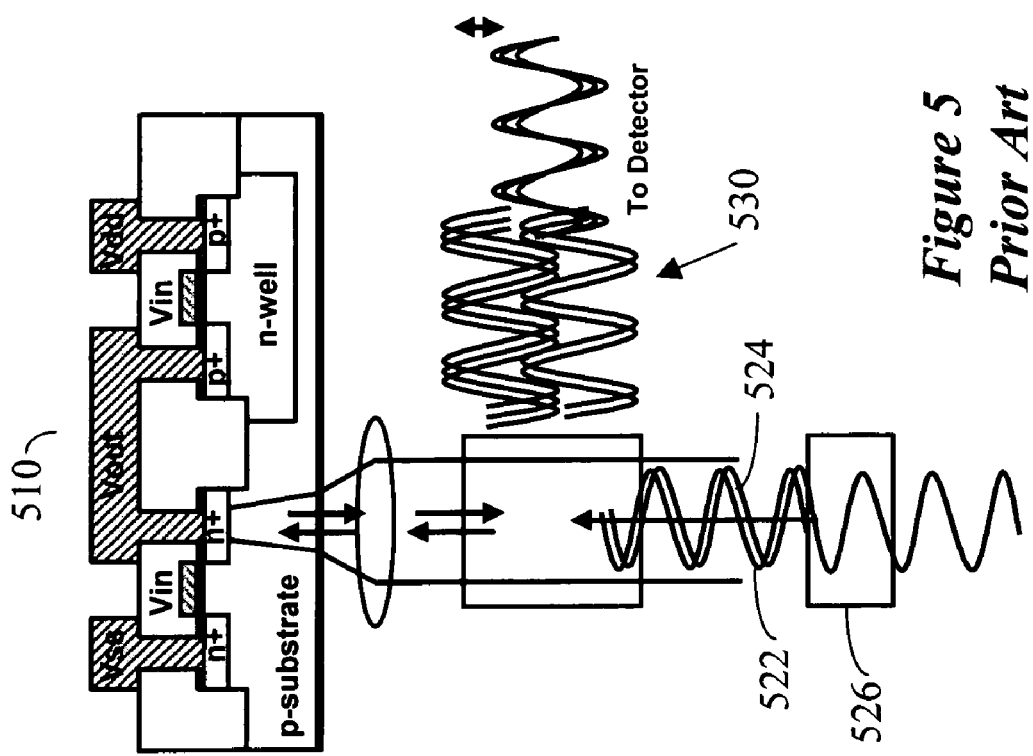
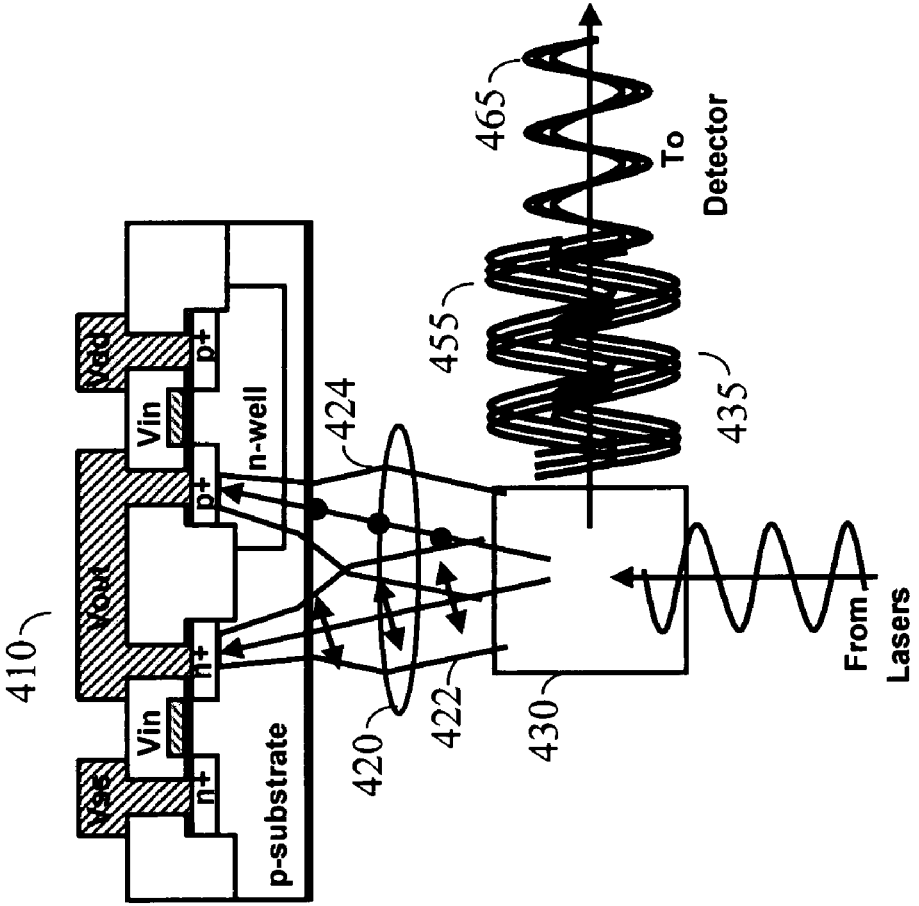

APPARATUS AND METHOD FOR PROBING INTEGRATED CIRCUITS USING LASER ILLUMINATION

BACKGROUND

1. Field of the Invention

The present invention relates to an apparatus and method for probing integrated circuits using laser illumination.

2. Description of the Related Art

Probing systems have been used in the art for testing and debugging integrated circuit (IC) designs and layouts. Various laser-based systems for probing IC's are known in the prior art. While some description of the prior art is provided herein, the reader is encouraged to also review U.S. Pat. Nos. 5,208,648, 5,220,403 and 5,940,545, which are incorporated herein by reference in their entirety. Additional related information can be found in Soref, R. A. and B. R. Bennett, *Electrooptical Effects in Silicon*. IEEE Journal of Quantum Electronics, 1987. QE-23(1): p. 123-9; Kasapi, S., et al., *Laser Beam Backside Probing of CMOS Integrated Circuits*. Microelectronics Reliability, 1999. 39: p. 957; Wilsher, K., et al. *Integrated Circuit Waveform Probing Using Optical Phase Shift Detection*, in International Symposium for Testing and Failure Analysis (ISTFA), 2000, p 479-85; Heinrich, H. K., *Picosecond Noninvasive Optical Detection of Internal Electrical Signals in Flip-Chip-Mounted Silicon Integrated Circuits*. IBM Journal of Research and Development, 1990. 34(2/3): p. 162-72; Heinrich, H. K., D. M. Bloom, and B. R. Hemenway, *Noninvasive sheet charge density probe for integrated silicon devices*. Applied Physics Letters, 1986. 48(16): p. 1066-1068; Heinrich, H. K., D. M. Bloom, and B. R. Hemenway, *Erratum to Noninvasive sheet charge density probe for integrated silicon devices*. Applied Physics Letters, 1986. 48(26): p. 1811.; Heinrich, H. K., et al., *Measurement of real-time digital signals in a silicon bipolar junction transistor using a noninvasive optical probe*. IEEE Electron Device Letters, 1986. 22(12): p. 650-652; Hemenway, B. R., et al., *Optical detection of charge modulation in silicon integrated circuits using a multimode laser-diode probe*. IEEE Electron Device Letters, 1987. 8(8): p. 344-346; A. Black, C. Courville, G Schultheis, H. Heinrich, *Optical Sampling of GHz Charge Density Modulation in Silicon Bipolar Junction Transistors* Electronics Letters, 1987, Vol. 23, No. 15, p. 783-784, which are incorporated herein by reference in their entirety.

As is known, during debug and testing of an IC, a commercially available Automated Testing Equipment, also known as Automated Testing and Evaluation, (ATE) is used to generate test patterns (also referred to as vectors) to be applied to the device under test (DUT). When a laser-based probing system is used for the testing, the DUT is illuminated by the laser and the light reflected from the DUT is collected by the probing system. As the laser beam strikes the DUT, it is modulated by the response of various elements of the DUT to the vectors. This has been ascribed to the electrical modulation of the free carrier density and the resultant perturbation of the index of refraction of the material. Accordingly, analysis of the reflected light provides information about the operation of various devices on the DUT.

FIG. 1 is a general schematic depicting major components of a laser-based voltage probe system architecture, 100, according to the prior art. In FIG. 1, dashed arrows represent optical path, while solid arrows represent electronic signal path. The optical paths are generally made using fiber optic cables. Probe system 100 comprises a dual laser source, DLS 110, an optical bench 112, and data acquisition and analysis 114. The optical bench 112 includes provisions for mounting the DUT 160. A conventional ATE 140 provides stimulus signals 142 to the DUT 160, and trigger and clock signals, 144, to the probe controller 170 via time-base board 155. The time-Base Board 155 synchronizes the signal acquisition with the DUT stimulus and the laser pulses.

The various elements of probe system 100 will now be described in more detail. Since temporal resolution is of high importance in testing DUT's, the embodiment of FIG. 1 utilizes prior art pulsed lasers, wherein the pulse width determines the temporal resolution of the system. Dual laser source 110 consists of two lasers: a pulsed mode-locked laser, MLL 104, source that is used to generate 10-35 ps wide pulses, and a continuous-wave laser source, CWL 106, that is pulsed electronically to generate approximately 1 μs wide pulses. The MLL 104 source runs at a fixed frequency and must be synchronized with the stimulus 142 provided to the DUT 160, via a phase-locked loop (PLL) on the time-base board 155. The output of the DLS 110 is transmitted to the optical bench 112 using fiber optics cable 115. The light beam is then manipulated by beam optics 125, which directs the light beam to illuminate selected parts of the DUT 160. The beam optics 125 consists a Laser Scanning Microscope (LSM 130) and beam manipulation optics (BMO 135). The specific elements that are conventional to such an optics setup, such as objective lens, etc., are not shown. Generally, BMO 135 consists of optical elements necessary to manipulate the beam to the required shape, focus, polarization, etc., while the LSM 130 consists of elements necessary for scanning the beam over a specified area of the DUT. In addition to scanning the beam, the LSM 130 has vector-pointing mode to direct the laser beams to anywhere within the field-of-view of the LSM and Objective Lens. The X-Y-Z stage 120 moves the beam optics 125 relative to the stationary DUT 160. Using the stage 120 and the vector-pointing mode of the LSM 130, any point of interest on the DUT 160 may be illuminated and probed.

For probing the DUT 160, the ATE 140 sends stimulus signals 142 to the DUT, in synchronization with the phase-locked loop on the time-base board 155. In synchronization with the stimulus, the MLL 104 emits laser pulses that illuminate the particular device on the DUT that is being stimulated. The light is then reflected from the DUT, but the reflection changes character depending on the reaction of the device to the stimulus signal. The reflected light is then collected by the beam optics 125 and is transmitted to two photodetectors 136, 138 via fiber optic cables 132, 134. The output signal of the photodetectors 132, 134 is sent to signal acquisition board 150, which, in turn, sends the signal to the controller 170. Using the photodetectors signals and the synch signal from the time base board 155, the controller 170 can analyze the temporal response of the DUT. The temporal resolution of the analysis is dependent upon the width of the MLL pulse.

While the arrangement depicted in FIG. 1 has been used successfully in the art, the system has several drawbacks. From the usability and performance perspective, the phase-lock requirement puts restrictions on the usable DUT stimulus trigger and clock periods. This is a burden to the user because it prevents the user from testing at arbitrary clock frequencies and it requires additional setup by the user. Additionally, noise rejection performance is dependent upon the signal-processing algorithm. Optimizing this algorithm is difficult. From the economic perspective, the MLL is expensive, and custom electronics and software must be developed. The CWL source is also custom built to give the best vibration noise rejection, and its output must match the MLL in wavelength and spectral width. All these custom elements increase the complexity and the overall cost of the system.

A major difficulty encountered by all laser-base probe systems is deciphering the weak modulation in the reflected signal, which is caused by the response of the DUT to the stimulus. Another difficulty is noise introduced into the signal by the DUT's vibrations. Various beam manipulation optic, 135, designs have been used in the art in an attempt to solve these difficulties. FIG. 2 is a diagram illustrating standard amplitude detection mode used in the prior art. In FIG. 2, a laser probe is used to probe specific device 210, such as a transistor's source or drain of a DUT. A beam splitter 220 is used to separate the reflected beam from the incident laser beam. Amplitude modulation due to DUT interaction with the laser beam can be detected directly using a photodetector. However, the DUT interaction with the laser beam may cause changes mostly in the phase of the reflected laser beam, not its amplitude. Consequently, the signal strength would be too weak for pure amplitude detection. Additionally, DUT vibrations cause amplitude variations that are much stronger than the variation from the DUT activity of interest. This necessitates noise rejection schemes to make such an arrangement practical.

Since the DUT interaction with the laser beam causes change in the phase of the reflected beam, various phase detection schemes have been developed for the beam manipulation optics 135. FIG. 3 is a diagram illustrating phase detection scheme with Michelson Interferometer arrangement to convert phase to amplitude. This scheme is also referred to as Phase-Interferometric Detection, or PID, mode. To detect phase modulations, a portion of the incident beam from the laser source is directed into a reference arm consisting of a lens 340 and a mirror 330, using beam splitter 320. The remaining portion of the incident beam is directed to a specific area of interest on the DUT, and upon reflection it is modulated according to the DUT's response to a stimulus signal. The light beam, 355, reflected by the DUT, and the light beam, 335, reflected by the reference arm mirror 330, are then spatially recombined into a single beam 365 so that they can interfere. The interference effect converts relative phase differences between the reflected beam 355 and the reference arm beam 335 into amplitude differences in combined beam 365, which can then be detected by a photodetector.

While this arrangement helps detect phase variations caused by the DUT, using this optical arrangement exposes the system to additional noise source from phase variations caused by DUT vibrations. The DUT vibrations still modulate reflected DUT beam amplitude, but now also modulate the DUT beam phase, which generates larger resultant reflected beam intensity modulations. Additional adjustments that are required in order to get best performance include reference arm power control and reference arm mirror position control (to set phase offset between DUT and Reference Arm powers). Also, alignment of reflected DUT and reference arm beams can be difficult.

FIG. 4 is a diagram illustrating another scheme, generally known as (spatial) differential probing (SDP) for phase detection. A Wollaston prism, 430 is used to generate the two spatially separated beams, 422, 424. The two beams, 422 and 424, have orthogonal, linear polarization states. One beam, e.g., 422, is directed to the DUT active region; while the other beam, say, 424, can be directed to either an inactive region, or to an active region with complementary modulation. The advantage of the latter option is that the measured signal modulation is increased because the relative phase modulation between the two beams is doubled. In the particular example of FIG. 4, the two beams are directed to the drains of the p- and n-FETs of an inverter, which generates complementary modulations of the beam. Using this scheme the phase noise is reduced relative to the scheme illustrated in FIG. 3, because each beam is directed at the DUT, so that the DUT vibrations will tend to modulate the phase of both beams similarly.

As can be understood, various IC's have different layouts and different devices on the IC's have different dimensions. Therefore, using this embodiment for each new IC the user needs to decide where to place each beam for each test and each device to be tested within the chip. Moreover, since the beam needs to be placed at various locations on the chip, the system needs to be designed so that the beam separation is adjustable, which complicates the optics design. Additionally, the intensity ratio of the beams must be variable since the reflectivity of the regions where they are placed can differ. Power matching between the two beams is required for best results.

Experience with devices as depicted in FIG. 4 has shown that DUT vibrations can still generate amplitude fluctuations, even when a differential detection mode is used. Differential detection isn't completely effective at eliminating vibrations because it is difficult to maintain proper balance of the two spatially separated detection arms. In addition, the two return beams are not modulated identically by vibrations because they are not parked on identical structures.

FIG. 5 is a diagram illustrating time differential probing (TDP) scheme for phase detection. Two pulsed beams, 522 and 524, are time shifted by a small amount (approx. 10-100 ps) with respect to each other before DUT interaction by passing one through an optical delay line 526 (such as a thick piece of glass). After DUT reflection, the opposite beam is passed through the optical delay line to remove the relative delay between the two beams. The two beams are then allowed to interfere, 530. Since the two beams traverse a common path, DUT vibrations largely modulate both identically, making this scheme inherently vibration insensitive. However, the optics required to generate the delay are relatively complicated. Additionally, the beams are not completely identical. They have orthogonal polarization states so DUT interactions are not truly identical (birefringence effects can cause non-common mode variations of the beams). In this scheme, the resulting 'Waveforms' are derivatives of the logic signal and consist of positive and negative going peaks. This arrangement also requires high temporal resolution of the sampling, otherwise no signal will result. This can limit the maximum time span of a sampling window that can be used.

Accordingly, there is a need in the art for a system that will allow improved laser probing of a DUT, while simplifying operation and minimizing the system's complexity and cost.

SUMMARY

Various embodiments of the present invention provide apparatus and method for laser probing of a DUT at very high temporal resolution, while enabling use of a conventional continuous wave (CW) laser source.

In one aspect of the invention, a system for probing a DUT is provided, the system comprising a CW laser source, a beam optics designed to point a reference beam and a probing beam at the same location on the DUT, optical detectors for detecting the reflected reference and probing beams, a collection electronics, and an oscilloscope.

In various illustrative implementations the beam optics comprise a common-path polarization differential probing (PDP) optics. The common-path PDP optics divides the laser beam into two beams of orthogonal polarization—one beam simulating a reference beam while the other simulating a probing beam. Both reference and probing beams are pointed to the same location on the DUT. Due to the intrinsic asymmetry of a CMOS transistor, the interaction of the reference and probing beams with the DUT result in different phase modulation in each beam. This difference can be investigated to study the response of the DUT to the stimulus signal.

Various embodiments of the invention also provide for a Laser Scanning Microscope (LSM) operable in a scanning mode and a vector-pointing mode. The scanning mode is used to obtain an image of an area of the DUT for navigation purposes, while the vector-pointing mode is used to park the beam on a specific device for probing.

In another embodiment of the invention, a system for testing an integrated circuit (IC) stimulated to simulate operating conditions is provided. The system includes a navigation light path and a probing light path. A first illumination source is used in the navigation mode to obtain an image of a specified area of the DUT via the navigation light path. Then, the light path is switched to the probing mode and a second light source is used to probe the DUT. The second light source may be a laser light source and the probing light path may include the common-path PDP optics. The probing light path may further include a solid immersion lens (SIL).

According to one aspect of the invention, a system for testing an integrated circuit microchip using laser probing is provided, which comprises a laser source providing a laser beam; a beam optics receiving said laser beam and providing a first and a second orthogonally polarized beams; a beam pointing optics receiving said first and second orthogonally polarized beams and pointing the first and second orthogonally polarized beams onto the same point on the microchip; a first photodetector receiving reflected laser light that is reflected from said microchip and providing an electrical signal; collection electronics receiving the electrical signal from said photodetector and providing an output signal; and an analysis system receiving and analyzing said output signal.

According to another aspect of the invention, a method of testing an integrated circuit microchip is provided, the method comprising generating a laser beam; transferring the laser beam through optical elements so as to obtain a reference beam polarized in one direction and a probing beam polarized in an orthogonal direction to the one direction; pointing the reference beam and the probing beam at a common selected area on the microchip; and collecting and analyzing reflected light that is reflected from the selected area.

According to yet another aspect of the invention, an interferometer system is provided, comprising a laser source providing a laser beam; a polarizer polarizing said laser beam in a first direction; a Faraday rotator rotating the beam to align said polarization in a second direction, so as to effectively produce a first polarized beam aligned in said first direction and a second polarized beam aligned in a third direction that is orthogonal to said first direction; an optical retarder, retarding one of the first and second polarized beams; and an objective lens directing said first and second polarized beams onto a common point on a specimen.

Other aspects and features of the invention will become apparent from the description of various embodiments described herein, and which come within the scope and spirit of the invention as claimed in the appended claims.

BRIEF DESCRIPTION OF THE DRAWINGS

FIG. 4 is a diagram illustrating a spatial differential probing arrangement for phase detection according to the prior art.

FIG. 5 is a diagram illustrating time differential probing (TDP) scheme for phase detection according to the prior art.

Figure 1:
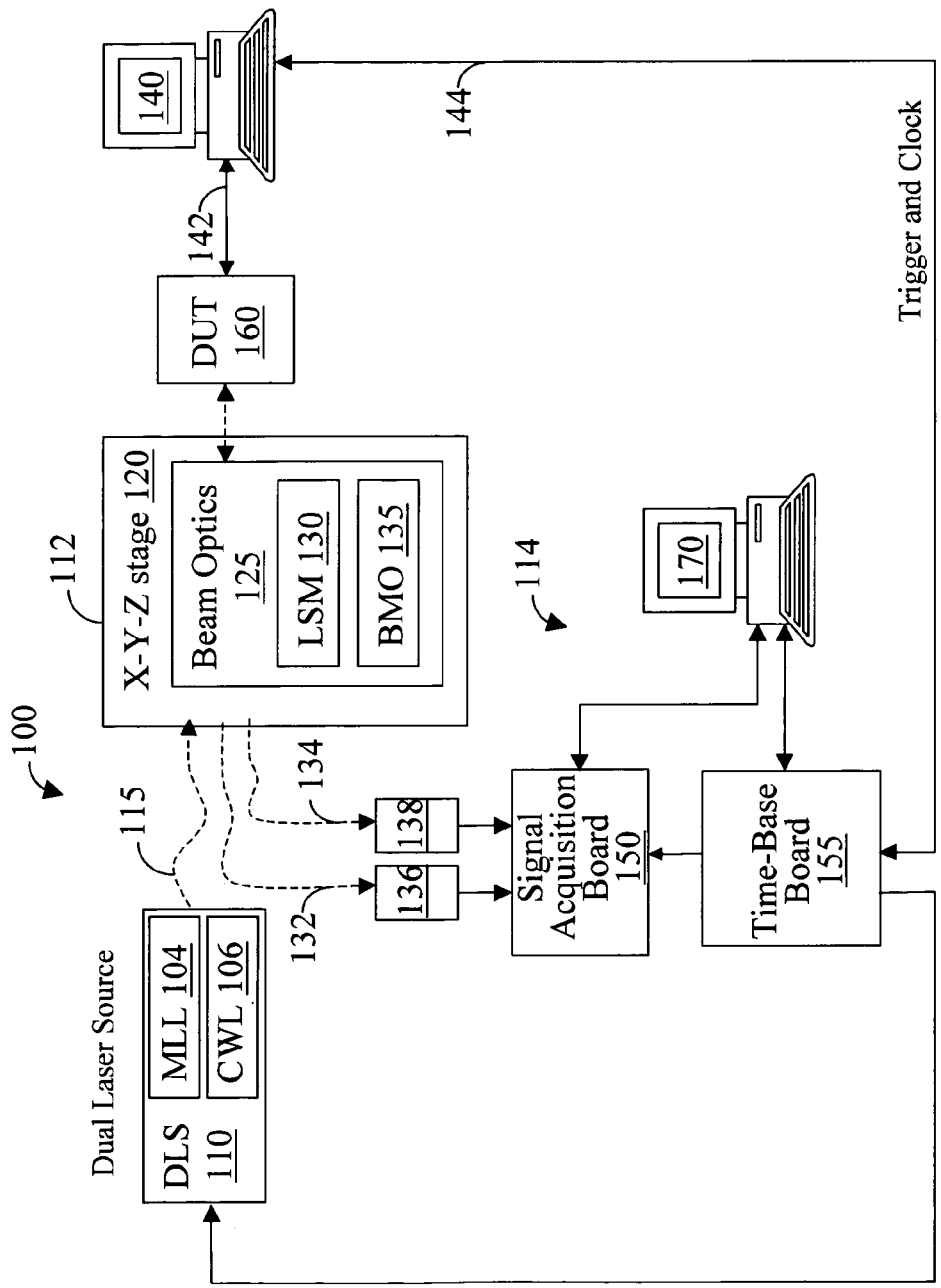
FIG. 1 is a general schematic depicting major components of a laser-based voltage probe system architecture according to the prior art.
Figure 3:
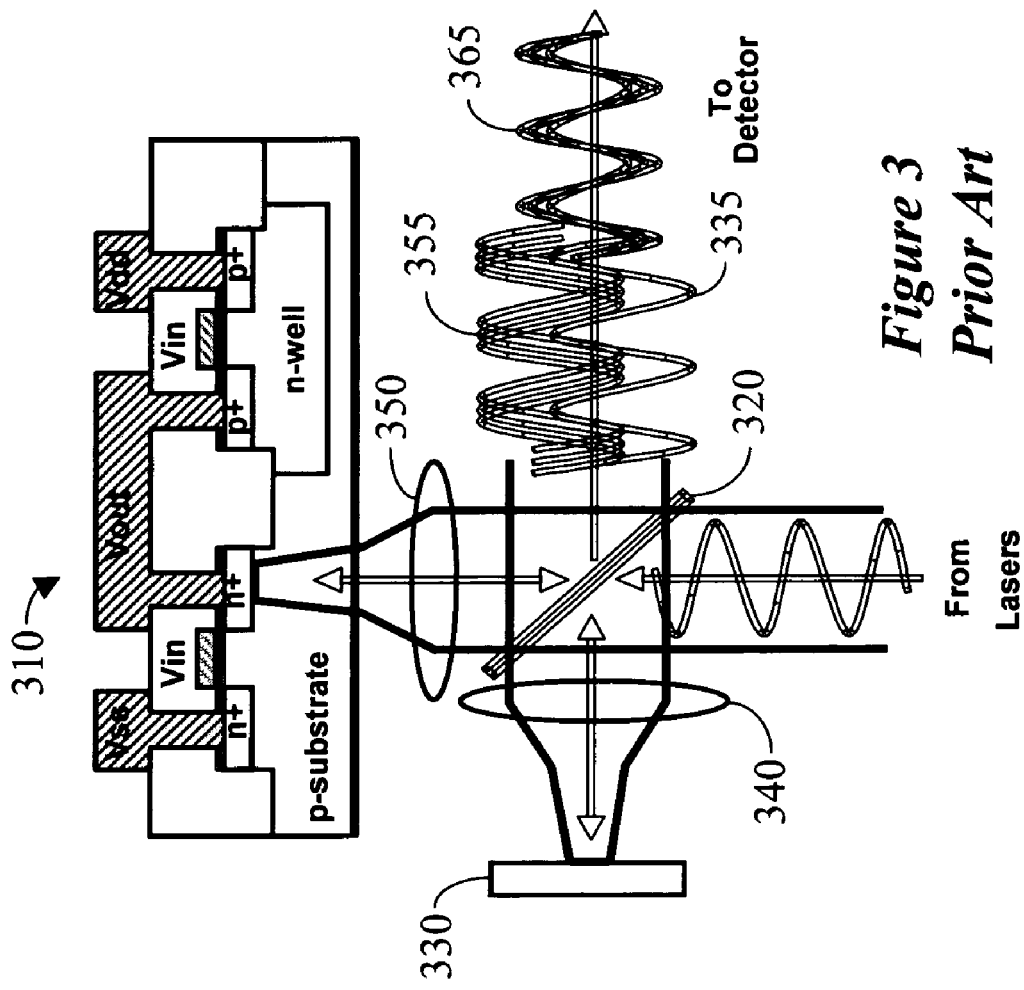
FIG. 3 is a diagram illustrating phase detection scheme with Michelson Interferometer arrangement according to the prior art.
Figure 2:
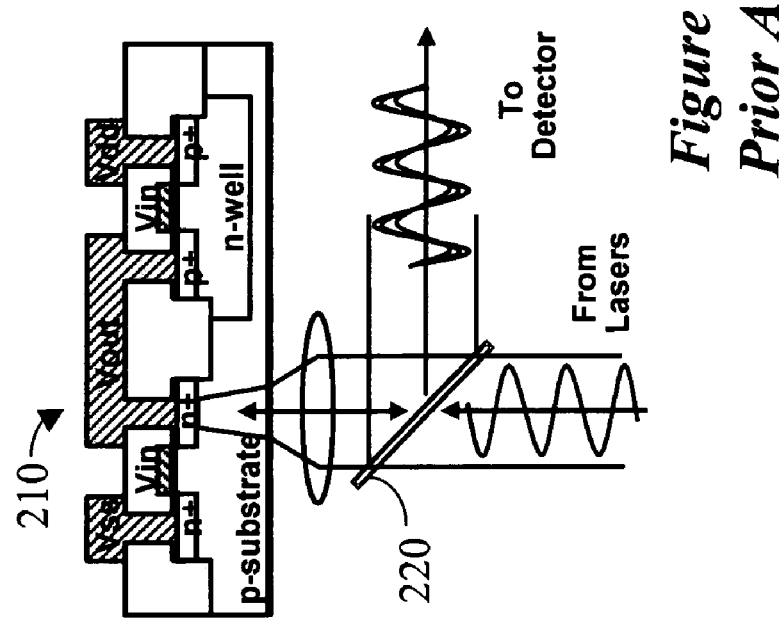
FIG. 2 is a diagram illustrating standard amplitude detection mode used in the prior art.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

An embodiment of the invention will now be described in details with reference to FIG. 6 and, for illustration purposes, it will be depicted in a manner highlighting differences from the system of FIG. 1. Most notably, in this embodiment of the invention a continuous wave (CW) laser source is used, rather than the pulsed laser source. Using a CW laser source reduces the overall cost and complexity of the system. Of course, as noted above, for laser probing of today's integrated circuits a high temporal resolution is needed, which led to the use of mode-locked lasers. In this embodiment, however, the CW laser is used in conjunction with a very wide bandwidth differential amplifier and a data acquisition arrangement to achieve the desired temporal resolution. Additionally, the system is capable of providing other information that does not necessitate temporal resolution. Other major differences include pointing the reference and the probing beam as the same location on the DUT, the use of a common-path polarization differential probing (PDP) optics. Still other differences would become apparent from the description provided below.

Figure 6:
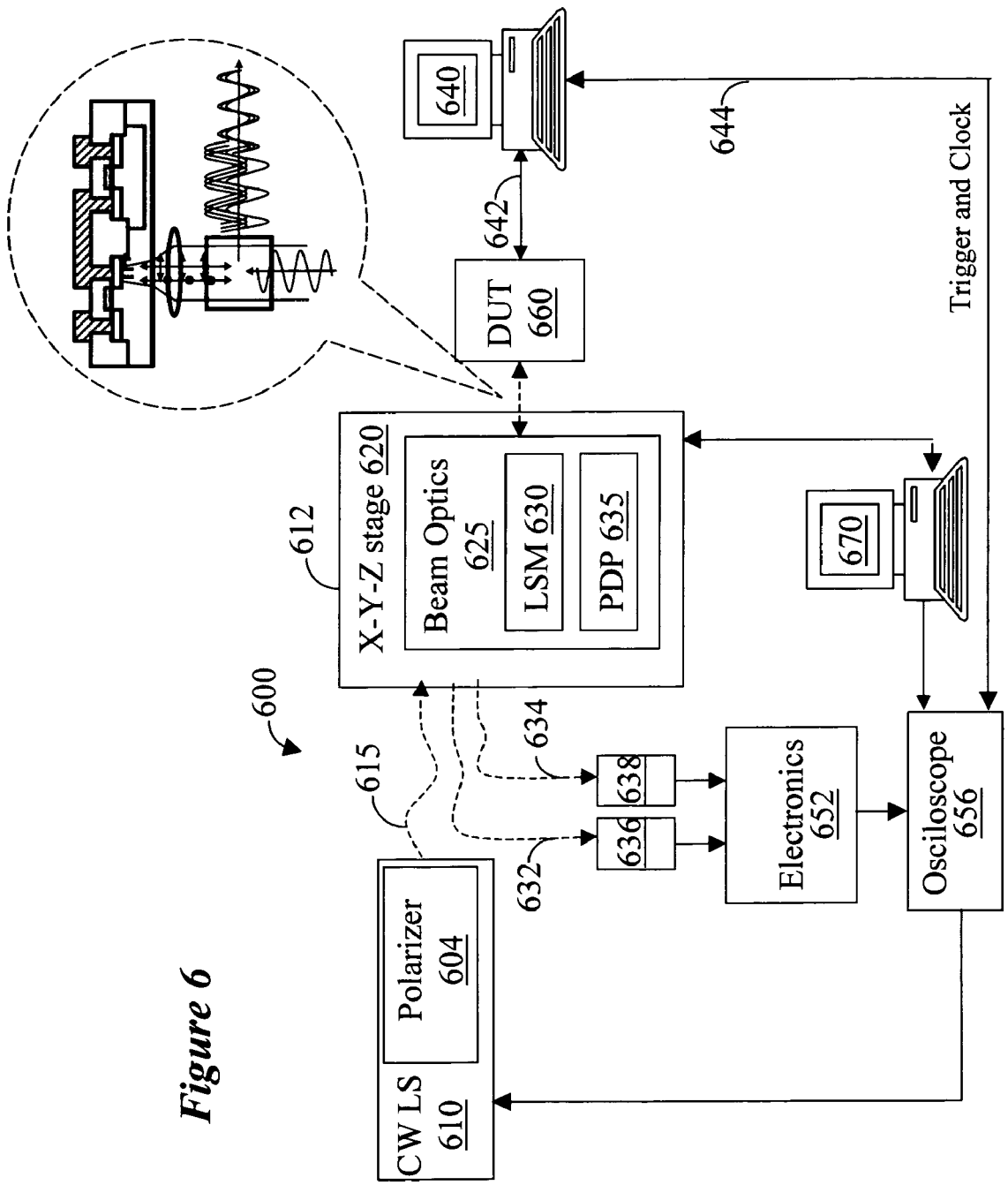
FIG. 6 depicts an embodiment of the present invention using CW laser source and a common-path PDP optics.

In FIG. 6 Laser source 610, a continuous wave laser source (CWLS), provides a continuous wave laser beam. It may be, for example, a diode-pumped solid-state (DPSS) laser, a semiconductor laser diode, etc. The wavelength can be an 'invasive' wavelength such as 1064 nm, or it may be a noninvasive wavelength (>1100 nm). By 'invasive' it is meant that the laser illumination interacts, i.e., generates electron-hole pair, with or causes significant changes in the response of the DUT; while the non-invasive beam is modulated mainly by free carriers. In some embodiments the laser source can also consist of multiple lasers with different wavelengths. For example, an invasive wavelength can be used in conjunction with a non-invasive, or less invasive wavelength.

In this particular embodiment, the laser beam is polarized in polarizer 604 and transferred to the beam optics 625 via fiber optics 615. Of course, free-space coupling can be used instead; however, if fiber optics coupling is used, it is expected to be polarization-maintaining fiber optics. Beam optics 625 needs to deliver the laser beam to selected points within the DUT. While any optical system for pointing a beam can be used, in this embodiment this is achieved by utilizing a Laser Scanning Microscope (LSM 630). An objective lens (not shown) is typically used to generate a focused spot in the DUT. The objective can be a normal air-gap objective, a liquid immersion objective, or a solid-immersion lens (SIL) objective.

In this embodiment beam optics 625 also includes a common-path polarization differential optics PDP 635. While other arrangement can be used, the common-path PDP 635 is expected to provide performance improvement and better ease-of-use compared to alternatives. The common-path PDP optics is described in more details below and its principle is illustrated in the broken-line circle in FIG. 6. Optics 625 is coupled to X,Y,Z stage 620 for navigation. Since movement of the optics relative to the DUT is the goal, the stage 620 can be arranged to move the optics (as shown) or it can be arranged to move the DUT. The stage 620 can be manually controlled, or electrically controlled using computer 670.

Light reflected from the DUT is collected and applied to fiber optics 632, 634. As before, fiber coupling is optional and free-space coupling can also be used. If fibers are used, they can be single mode fiber, multimode fiber variety, for maximum coupling efficiency, or they may be fiber amplifier type, to provide optical gain so as to reduce electronic noise. Other optical amplifiers may also be used. The fiber optics 632, 634, deliver the reflected light to photodetectors 636, 638. The photodetectors can be any conventional light detectors, such as PIN diode, avalanche photo diode (APD), etc. For example, an InGaAs APD with 6 GHz bandwidth, conventionally used by the telecom industry, can be used. APD's have internal gain and can be used so as to reduce the overall system electronic noise. The internal gain of APD's can be changed by varying the applied reverse bias voltage. The output signal of the photodetectors 636, 638 is collected by receiver electronics 652, and the output of the receiver electronics 652 is applied to the oscilloscope 656.

Various embodiments of the receiver electronics 652 will be described below. On the other hand, the oscilloscope 656 may be a conventional off-the-shelf instrument, or may be replaced with other conventional testers such as, e.g., spectrum analyzer, edge discriminator (for jitter investigations), a lock-in amplifier, etc. For an improved ease-of-use, the oscilloscope 656 may be controlled by computer 670. Specifically, computer 670 can be programmed to enable better control by providing a simpler and programmable user interface. For optimal system performance the oscilloscope 656 should be chosen to have certain capabilities, such as high memory capacity and high memory access speed. In this embodiment, the oscilloscope's memory is segmented to provide enhanced capability.

The system of FIG. 6 can be operated in two general modes: navigation mode and data acquisition or probing mode. During navigation, the LSM is used to scan a designated area of the DUT and provide an image of that area. This image can be used for navigation, i.e., to place the laser beam at a particularly desired location or device during probing mode. As will be shown further below, using an LSM is but one method for imaging an area for the navigation function, but other methods can be used to obtain an image of a selected area. For example, an arrangement, such as a CCD camera, can be used to obtain an image of a designated area of the DUT. Once an image is acquired and a location or device to be tested/probed is selected, the laser beam is pointed to that location using, in this embodiment, the LSM. That is, in the probing mode the LSM is not used to scan an area, but rather to "park" the laser beam at a designated location.

During data acquisition operation, the laser beam is pointed to a particular point on the DUT, while the DUT is stimulated using various stimulus signals 642. When the test signal is applied to the illuminated device, the laser light reflected from that device is modulated by the reaction of the device to the stimulating signal. The reflected laser light is then collected and analyzed by the system. When the output signal obtained by the system is faint, the stimulus signal 642 should be designed to drive the DUT in a repetitive manner so as to obtain several measurements for each desired location/device, and the resulting measurements may be averaged. The signals 642 may be as simple as power and ground plus a test signal delivered via conventional probes (not shown). Of course, for more complex ICs and more elaborate testing, an ATE tester 140 can be used to deliver complex and programmable signals 642, or the DUT can be running test signals internally and independently. Regardless of the stimulus applied, a trigger signal 644 may also be provided to synchronize the oscilloscope 656, depending on the information sought. For example, if the DUT is being tested for temporal response to the stimulating signal, then a synchronizing signal should be provided to the oscilloscope. However, for other investigations, e.g., when a spectrum analyzer is used, no synchronization signal is needed.

The optical bench 612 may include a conventional vibration isolation system (not shown) to isolate the DUT 660 and the beam optics 625 from ambient or vibrations noise or mechanical noise generated by the DUT stimulus. The use of vibration isolation system may be avoided by proper optical system design. The goal is to minimize unwanted movement of the DUT 660 relative to the beam optics 625 during imaging and signal acquisition. Relative movement can cause return laser intensity variations (due to defocusing effects, for example) that degrade the signal to noise ratio (SNR) of the measurement and degrade image quality.

As can be understood, the inventive system is advantageous over the prior art system in that it uses mostly inexpensive and conventionally available components in an arrangement that produces superior results to prior systems using specifically designed components. For example, the described embodiment uses a CW laser source, rather than the complex mode-locked laser source. Similarly, a commercially available oscilloscope can be used, rather than complex and custom high-speed timing electronics. The light detectors can be InGaAs APD's which are conventionally used by the telecom industry. Additionally, the common-path PDP optics provides ease-of-use benefits over previous schemes, especially since both the reference and probing beams are aimed at the same location. The common-path PDP optics also reduces the sensitivity of the system to vibrations, as both the reference and probing beams traverse the identical path.

Figure 7:
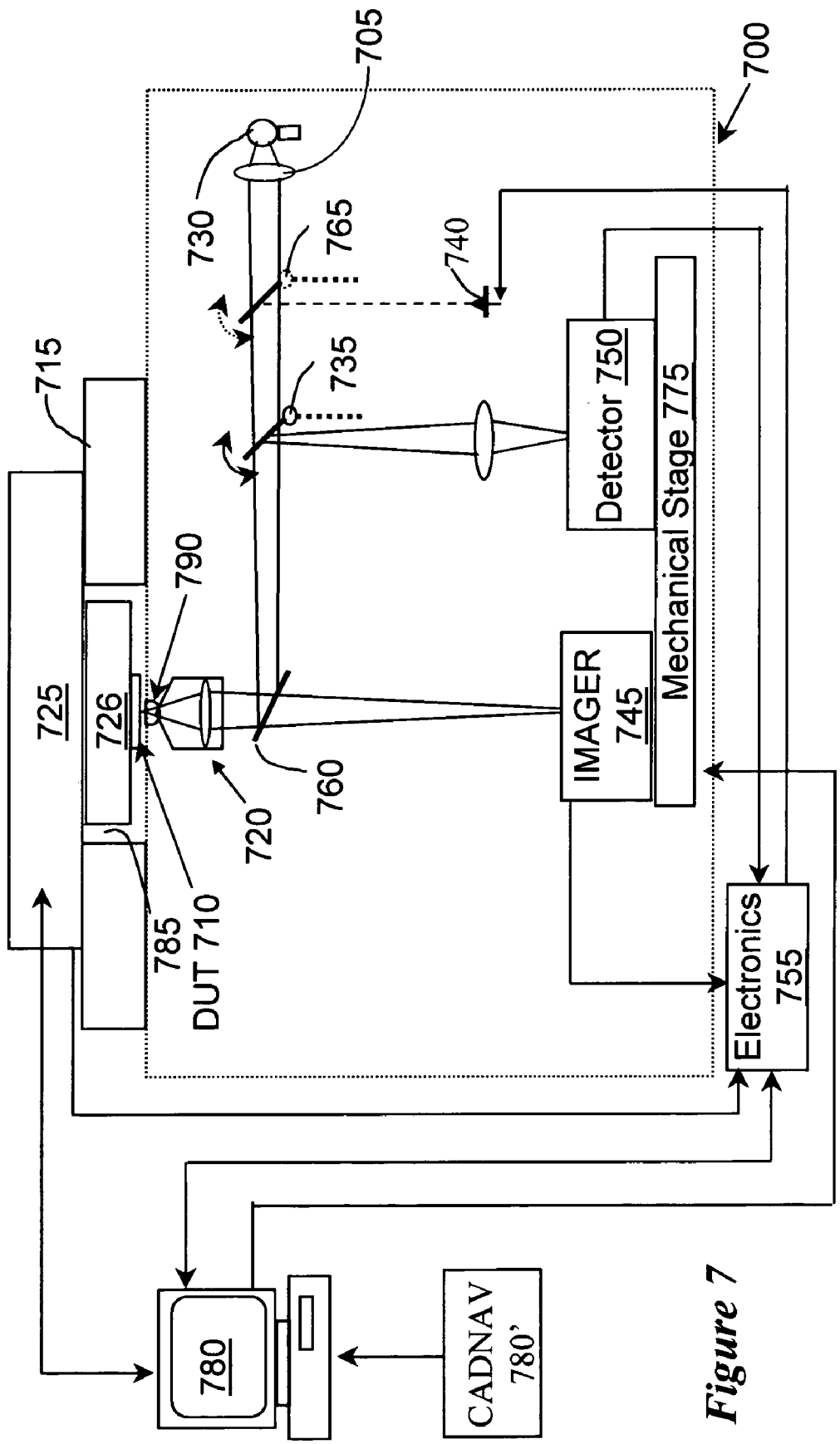
FIG. 7 depicts another embodiment of the present invention using two optical paths.

FIG. 7 depicts another embodiment of the inventive system, wherein two optical paths are provided, one for navigation and one for probing. System 700 includes a vibration isolation tabletop 715 that supports a DUT adapter 725, providing electrical connections to the DUT load board 726 onto which DUT 710 is loaded. System 700 also includes a mechanical stage 775, upon which the optical elements are assembled. In this embodiment, the optical elements are arranged so as to provide a navigation optical path and a probing optical path. To establish the navigation optical path, mirrors 735 and 765 are placed in the downward pointing position, as illustrated by the broken lines. With the mirrors 735 and 765 in this position, the light source 730 is turned on and its light is collected by lens 705 and directed toward mirror 760. The light is then reflected by mirror 760 and is made to pass through beam optics 720 and therefrom to illuminate the DUT 710. The light returned from the DUT 710 is collected by imager 745 and the imager's output signal is collected by electronics 755 and sent to computer 780, so as to provide an image of the illuminated area of the DUT. The imager 745 can be any conventional two-dimensional detector capable of imaging the DUT 710, such as, for example, vidicon camera, or a InGaAs focal plane array.

The image obtained can be used for navigation and correct placement of the laser beam for probing. That is, depending on the particular test to be run, one may wish to select any particular section or device on the DUT for laser probing. Using information about the chip design and layout stored in CAD software 780', such as, for example, Cadence™, and using navigation software 780', such as, for example, Merlin's Framework™ available from Knights Technology (www.electroglass.com), one may select a particular device for any particular test and use computer 780 to place the beam at the correct location for the test.

To switch to laser probing mode, mirrors 735 and 765 are flipped into the position illustrated in solid lines. In this position light source 730 is turned off and laser source 740 is turned on. Light from laser source 740 is deflected by mirrors 765 and 760, so as to enter beam optics 720. Beam optics 720 may be a common-path PDP optics as described herein. Additionally, in this arrangement an optional solid immersion lens (SIL) 790 is added to the beam optics 720. SIL 790 may be any conventional solid immersion lens and may be used in conjunction with index matching fluid. The laser beam is reflected by the DUT and the reflection is collected by the beam optics 720, deflected by mirrors 760 and 735, and detected by detector 750. As explained before, the reflected light is modulated by the DUT according to its response to the test signals. The output of the detector 750 is collected by the electronics 755 and sent to computer 780. For that purpose, electronics 755 includes the necessary elements as described herein, such as, e.g., differential amplifier, balanced receiver, spectrum analyzer, oscilloscope, edge analyzer, etc. The utilization of these elements will depend on the application. Additionally, as with the other embodiments described herein, if temporal resolution is needed, a synchronization signal may also be provided from the test signal generating equipment.

Figure 8:
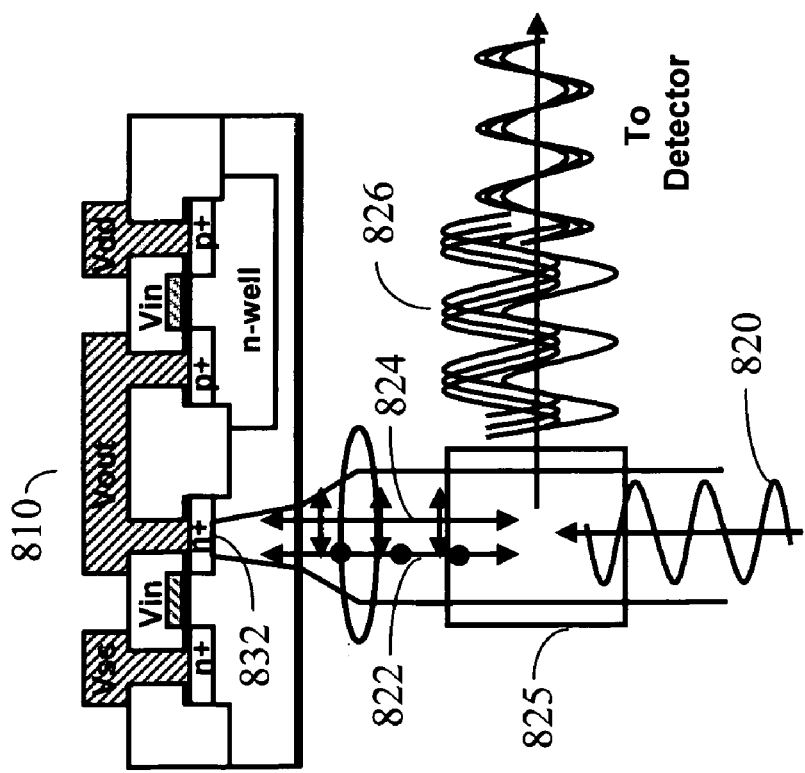
FIG. 8 is a diagram illustrating the polarization differential probing (PDP) mode for phase detection according to an embodiment of the invention.

FIG. 8 is a diagram illustrating the polarization differential probing (PDP) mode for phase detection according to an embodiment of the invention. A laser beam 820 from a single laser source is split into two orthogonally polarizes laser beams 822, 824, by beam optics 825. Both beams 822, 824 traverse the same optical path, but have orthogonal linear polarization states. Unlike the polarization scheme of the prior art where two different locations on the DUT are illuminated by the reference and the probing beams, in this embodiment both beams are made to incident on the same point 832 on the DUT 810. For optimal effect, the polarization directions of the beams 822, 824 are aligned with the transistor gate width and length directions in the DUT 810. This polarization difference results in phase modulation differences between the two beams after DUT interaction, as will be demonstrated below with reference to FIG. 9. The two beams 822, 824 are made to interfere 826 after their DUT interactions. A differential detection scheme is then employed to increase signal modulation.

Figure 9:
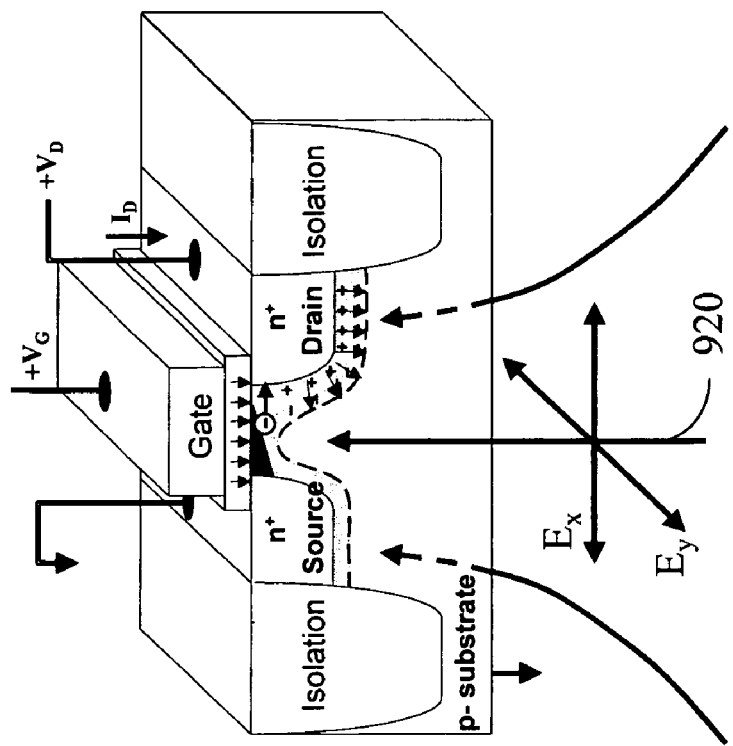
FIG. 9 is a diagram illustrating why the laser probing signal modulation is intrinsically polarization sensitive for CMOS transistors due to the intrinsic asymmetry of the CMOS device.

FIG. 9 is a diagram illustrating why the laser probing signal modulation is intrinsically polarization sensitive for CMOS transistors due to the intrinsic asymmetry of the CMOS device. A laser beam 920 is incident from the bottom (through the silicon substrate). For maximum Franz-Keldysh effect (electro-absorption/refraction), the laser beam's polarization state should be aligned parallel to the direction of the strong modulating fields in the gate/drain regions of the transistor, i.e., along the gate length direction (along $E_x$ in FIG. 9). On the other hand, the Plasma-Optical effect requires the laser beam to drive the charge carriers induced under the gate. Since the charge carriers are less constrained in the gate width direction, a laser beam polarized along $E_y$ should be most sensitive to this effect. In practice, the laser beam is found to be most strongly modulated when its polarization vector is aligned along $E_y$. Using these effects, the present inventors realized that, unlike the prior art interferometric arrangements, the reference beam need not traverse a reference path separate from the probing path. Rather, it is possible to have both reference and probing beams traverse the same path and be pointed onto the same point on the DUT, while still obtaining an interferometric effect that correlates to the DUT's response to the stimulating signal.

Figure 10:
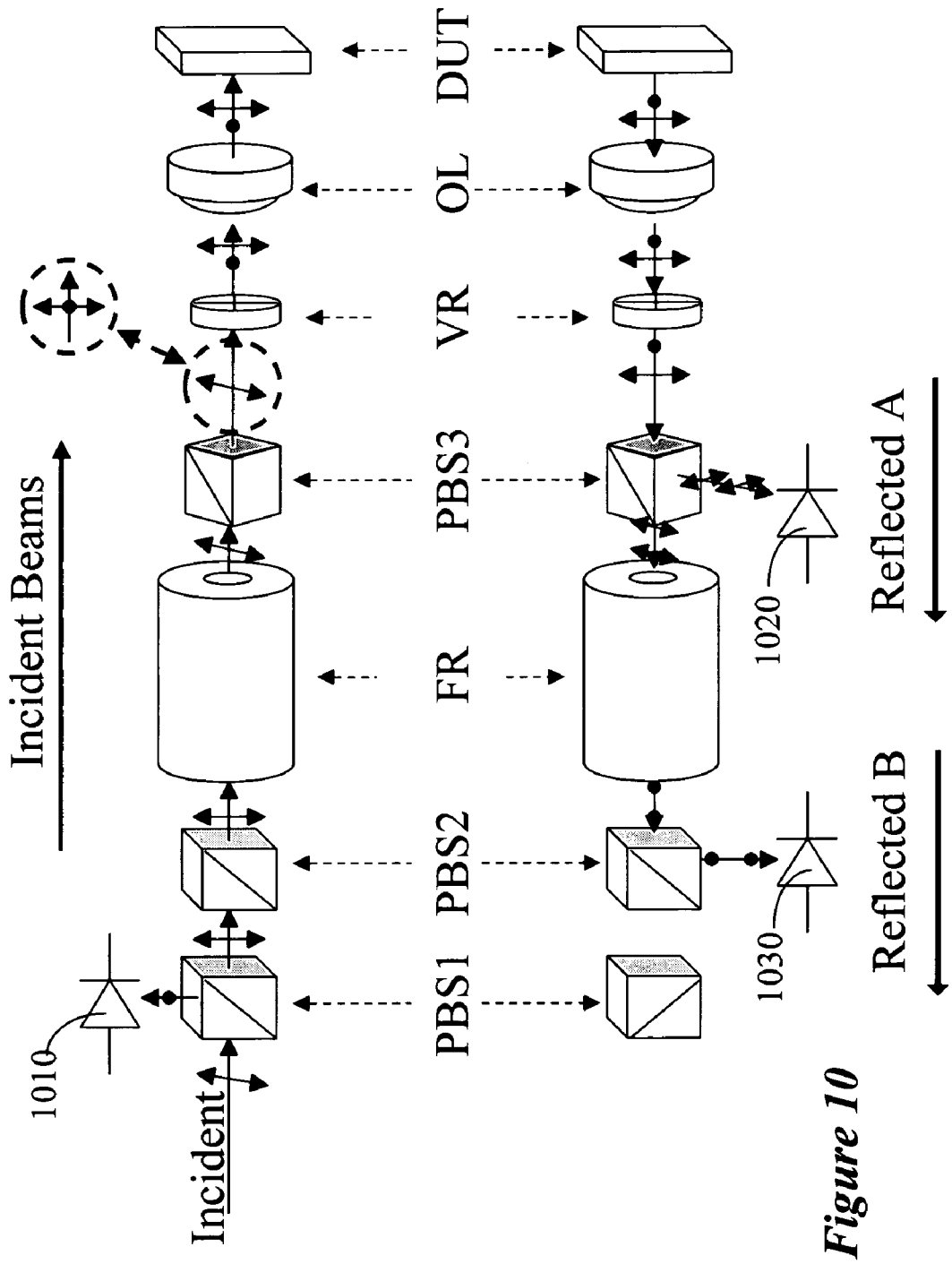
FIG. 10 is an illustration depicting a PDP optical path according to an embodiment of the invention.

FIG. 10 is an illustration depicting a common-path PDP optical arrangement according to an embodiment of the invention. While in actuality the incident beam and the reflected beam traverse the same elements, for better understanding the illustration is divided into two optical paths, showing each optical element twice. The top path is the incident beam path originating from the laser source, while the bottom path is the reflected beam path. Along the beam path, vertically oriented arrows indicate a vertically polarized beam while dots indicate a horizontally polarized beam. A tilted arrow indicates a beam that is linearly polarized at some angle off the vertical. Spatial separation between a dot and an arrow depicts a phase difference between the two beams.

The beam from the laser source enters the first polarizing beam splitter PBS1 so that part of the beam is deflected towards light sensor 1010. The output of the sensor 1010 is used to monitor the beam's intensity and is not part of the PDP optics, but rather an optional intensity monitor. The remaining part of the beam that passes through the first PBS cube (PBS1) enters the second polarizing beam splitters PBS2, which is oriented to pass only a vertically oriented beam. The beam's polarization state is rotated 45 degrees from the vertical by the action of the Faraday rotator (FR) and the third PBS cube (PBS3) is oriented to transmit the rotated beam. Consequently, at this stage the beam is the equivalent of superposition of a vertically polarized beam and a horizontally polarized beam, both beams equal in amplitude and in phase with each other. The dotted circles in the incident beam path, between PBS3 and VR, indicate the equivalence between a 45-degree polarized beam and two in-phase, equal amplitude beams that are polarized vertically and horizontally.

The two beams then enter the variable retarder VR. The fast and slow axes of the variable-retarder (VR) are aligned along these two vertical and horizontal polarization directions. Thus, after passage through the VR, the beam consists of two spatially coincident, equal-amplitude, orthogonally polarized beams that are phase-shifted (retarded) with respect to each other by a small amount (nominally, $\pi/4$). This is indicated in the illustration by the dot being slightly behind the vertical arrow. The two beams are then focused onto the same point on the DUT by the objective lens OL. The DUT is oriented such that the polarization directions of these two beams are aligned with the length and width directions of the transistor gates. Interaction with the DUT phase modulates one of the beams relative to the other by a small amount. In this manner, the beam being modulated by the DUT may be thought of as the probing beam, while the other beam may be thought of as the reference beam. Of course, unlike prior art interferometers, here none of the beams traverses a reference optical path, but rather both beams traverse the identical path to the probing location. Therefore, in this sense, there is not reference beam and probing beam, but for convenience one may refer to one beam as the reference beam and the other as the probing beam.

After the beams are reflected by the DUT (FIG. 10, bottom) the two linearly polarized beams retrace their path to the VR. Passing through the VR introduces an addition phase-shift between the two returned reference and probing beams (now nominally phase-shifted by $\pi/2$). At PBS3, a portion of each beam is reflected and sent to photosensor 1020, and the other portion is transmitted. The reflected portions interfere, since they are now in the same polarization state, and generate the reflected-A signal. In one embodiment, only one photosensor 1020 is used and its output is collected by the receiver electronics and analyzed, as described in more detail below. According to another embodiment, the transmitted portions are deflected out of the beam path via the action of FR and PBS2 so as to be detected by a second photosensor 1030. The transmitted halves also interfere for the same reason, generating the reflected-B signal. The reflected-B signal is collected by the receiver electronics and is analyzed, as described in more details below.

As can be understood, since both reference and probing beams are pointed to the same location on the DUT, it means that this scheme has better phase noise immunity then prior art interferometric systems. Additionally, there is no need to find a second location for the reference beam for each location tested. Rather, both beams are always pointed at the location to be tested. Accordingly, there is also no need to introduce separate spatial control of the reference and probing beams. Consequently, the inventive common-path PDP arrangement can be used in multiple applications where phase interferometry is needed.

Figure 11A:
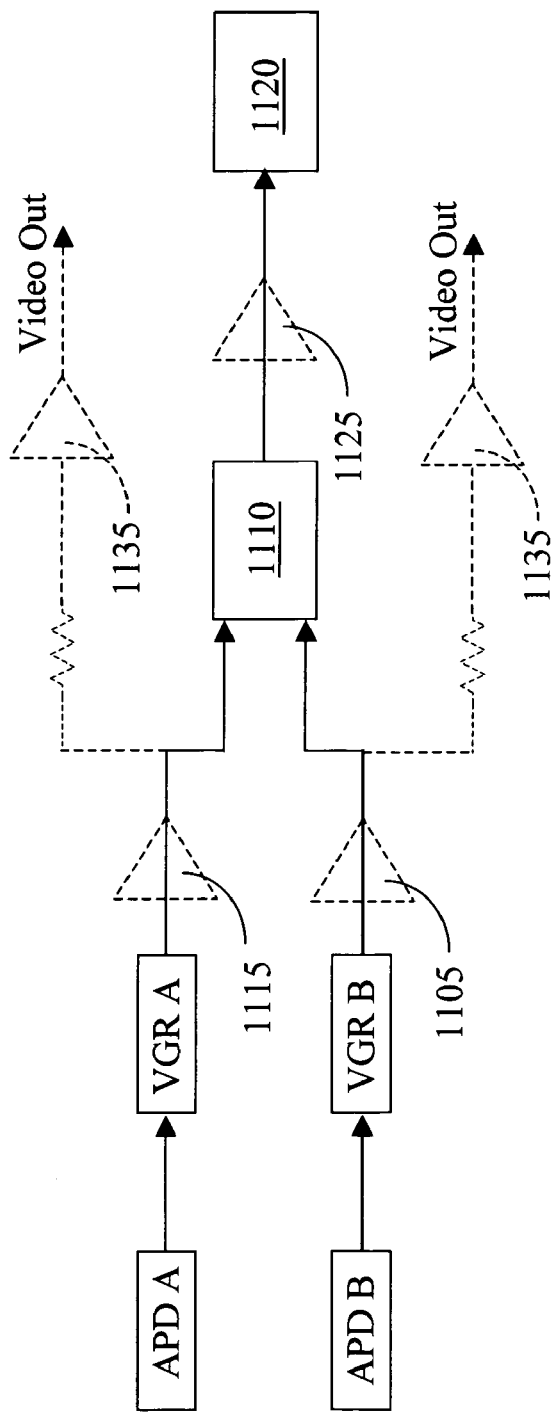
FIGS. 11A and 11B are diagrams of the receiver electronics according to embodiments of the invention.

FIG. 11A is a block diagram of the receiver electronics according to an embodiment of the invention. The output of the two photodetectors, e.g., APD A and APD B, are applied to two variable gain receivers, VGR A and VGR B. The output of the variable gain receivers may optionally be amplified by amplifiers 1105 and 1115, and then applied to the balanced receiver 1110. The output of the balanced receiver may also be amplified by amplifier 1125, and then applied to the measurement equipment 1120, such as an oscilloscope, spectrum analyzer, edge discriminator, etc. For navigation and imaging, the signal from one or both APD's may be DC coupled to a video amplifier 1135. In FIG. 11A two video amplifiers are shown in broken lines, as the arrangement can be optionally constructed with a single video amplifier coupled to only one APD, two amplifiers, each coupled to one APD, or a subtracting arrangement wherein the signals from the APD's are subtracted from each other to provide a difference video image.

Figure 11B:
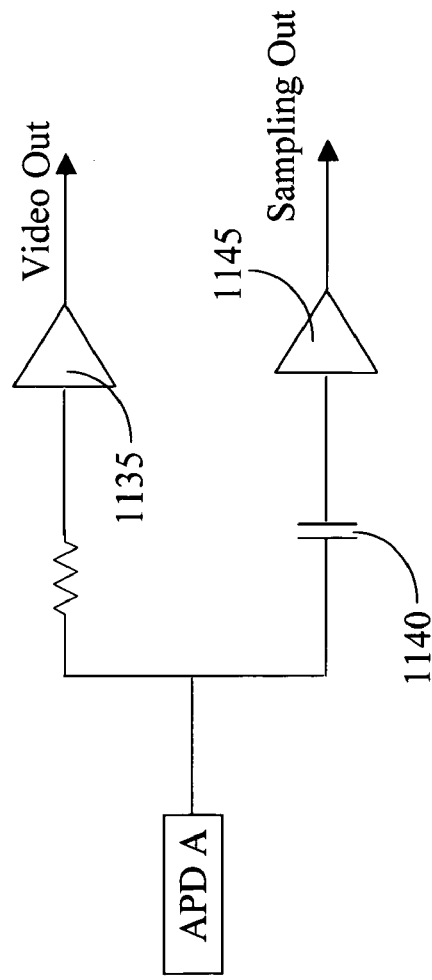

On the other hand, FIG. 11B illustrates a receiver electronics according to an embodiment of the invention when only one photosensor is used. In this example, when the system is in the navigation mode, the signal from APD A is DC coupled to video amplifier 1135, and a video out signal is output from the video amplifier 1135. When the system is in probing mode, the signal from APD A is sent through high pass filter 1140 to high-bandwidth, high-gain signal amplifier 1145 to provide a signal that is applied to a high speed digitizer, a digital oscilloscope, a spectrum analyzer, etc. The filter 1140 can be set to filter signals below, e.g., 1 KHz to reduce or eliminate any signal noise caused by DUT vibration and other noise. The sampling out signal may be sent to an oscilloscope.

Figure 12:
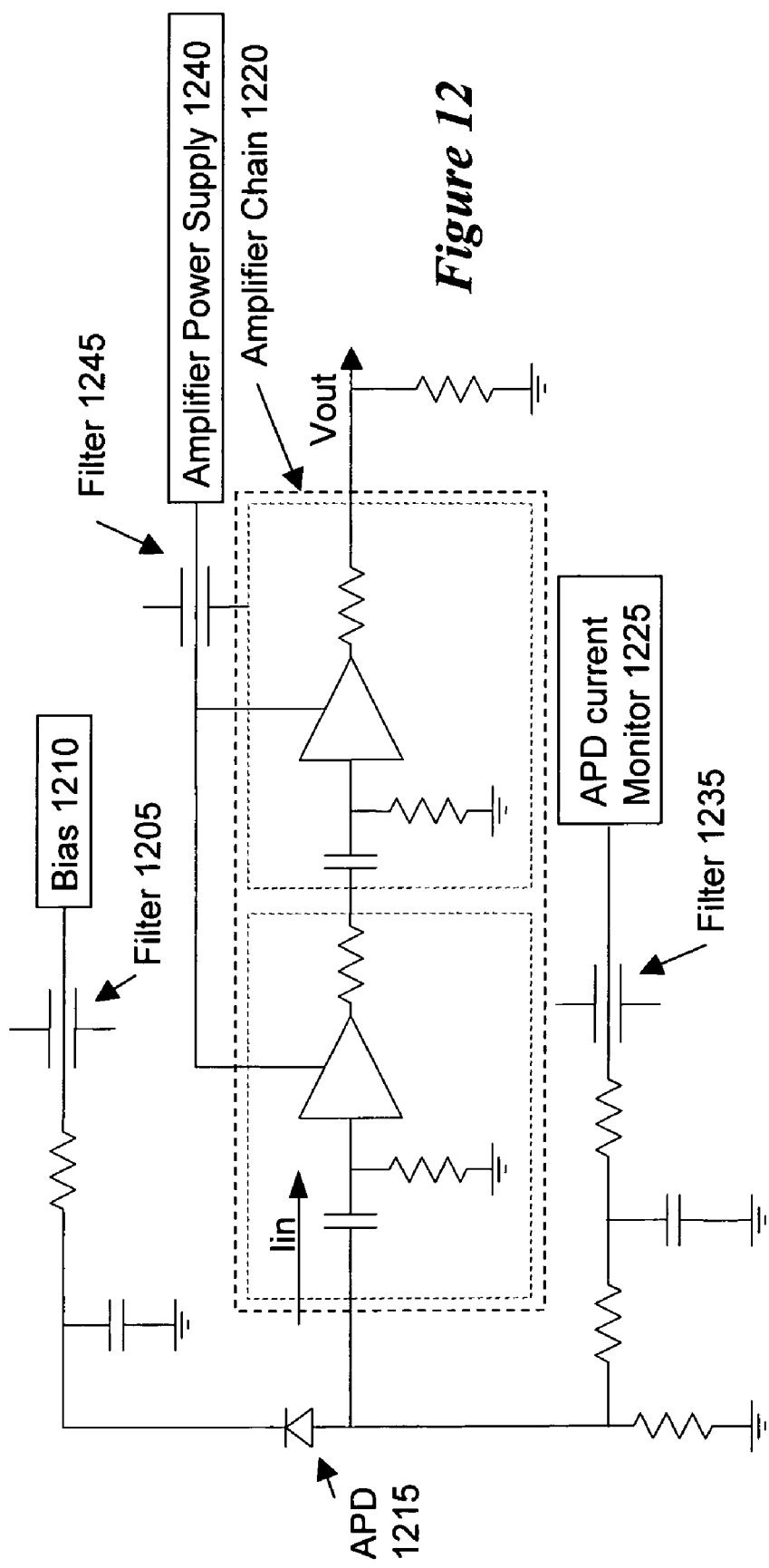
FIG. 12 depicts an embodiment of receiver electronics for a single photodetector, non-differential detection mode.

FIG. 12 depicts an embodiment of receiver electronics for a single photodetector, non-differential detection mode. This receiver electronics can be used when the change in the probing beam is sufficiently high so that only one photodetector, e.g., photodetector 1020 in FIG. 10, is needed for the probing operation. As shown in FIG. 12, a bias 1210 is applied to APD 1215 via filter 1205. The current flowing through the APD is monitored using current monitor 1225, which is connected to the APD via filter 1235. Filter 1235 is mainly provided in order to reduce signal interference. To obtain an output signal, the APD 1215 is connected to amplifier chain 1220 (illustrated as line in, i.e., Iin—standing for current in) which, in this particular embodiment provides a total gain of about 50K V/A. Filters 1205, 1235, and 1245 prevent interfering signals of the APD bias, the APD current monitor 1225, and the amplifier power supply 1240, from getting to the input of the very high gain amplifier chain 1220. The AC coupled amplifier chain has reduced gain at the typical DUT vibration frequencies (1 KHz and below) so that the noise on the amplified signal due to DUT vibration modulation is greatly reduced. The output, Vout, of the amplifier chain is sent to a high speed digitizer and is stored in memory for further analysis and display (not shown).

In any of the disclosed embodiments, it is advantageous to make the cutoff of the amplifier low, otherwise the low frequency component of the signal of interest would be almost completely attenuated. In an ideal situation, to capture the signal with good fidelity the response of the amplifier should extend down in frequency to the DC. However, in practice the reflected beam will carry a low frequency noise, mostly at about 10-200 Hz, due to DUT vibrations relative to the incident beam. The noise introduced by the DUT vibration can be very large as compared to the beam modulation, which is the signal of interest. Therefore, a cutoff in the amplifier's response should be introduced so as to remove this noise. The cutoff may be set at, say 100 KHz or below.

Figure 13:
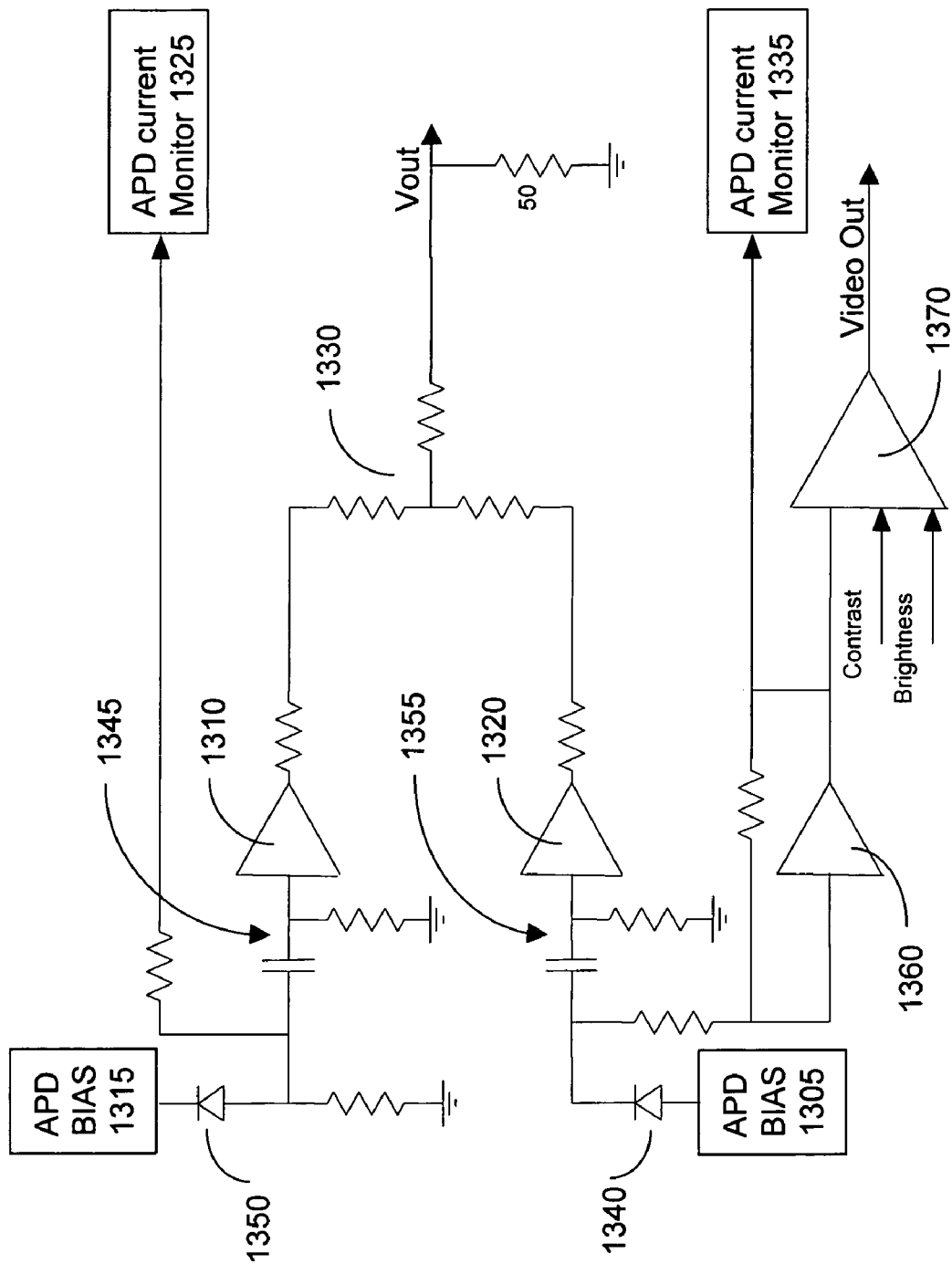
FIG. 13 depicts an embodiment of receiver electronics for a two photodetectors, differential detection mode.

FIG. 13 depicts an embodiment of receiver electronics for a two photodetectors, differential detection mode. For an increase in light intensity of the probing signal, two photodiodes are used in a differential detection mode. One diode produces a positive going signal at its amplifier input, while the other one produces a negative signal. Summing the two output signals produces an enhanced differential signal. As shown in FIG. 13, APD 1340 is negatively biased by APD bias 1305, and its current is monitored by current monitor 1335. In this embodiment, the bias is to about −60V. The other APD 1350 is positively biased by bias 1315 to approximately the same, but opposite value of bias 1305 (e.g., +60V), and its current is monitored by current monitor 1325. Monitoring the current of both APD's assists in checking the balance of the PDP optics, as the variable phase plate of the PDP can be adjusted until the same current is observed by the two current monitors 1325 and 1335.

The signal from APD 1340 is applied to amplifier 1320, while the signal from APD 1350 is applied to amplifier 1310. The output of both amplifiers are applied to a simple resistive summing junction 1330 to effectively add the two APD signals together and provide a probing signal Vout. The probing signal is sent to a digitizer for data storage and processing. In this embodiment filters 1345 and 1355 have been introduced to remove vibration and other noise appearing at below about 2 KHz.

During navigation, signal from only one APD is required to obtain an image of the DUT. As is shown, the signal from APD 1340 is also sent to amplifier 1360 and therefrom to video amplifier 1370, which provides a video out signal for processing and display. Other imaging methods may be performed with the resulting advantageous features as follows. In order to provide contrast control, the variable retarder may be varied to tune the retardation so that the image contrast is varied to the desired result. Additionally, imaging may be performed using both APD's and the resulting images subtracted from each other so as to obtain a difference image.

In the various embodiments disclosed where two APD's are used, the APD's gain may be advantageously controlled to, first, balance the APD's response and, second, to improve the imaging. Using a controllable variable power supply that is manually or automatically controlled, the voltage/gain response of each APD can be determined. Then, using the learned voltage/gain response, the gain of each APD can be controlled to a desired value by selecting the appropriate voltage on the corresponding power supply. For balancing the system, the following procedure may be used. First, the voltage of the power supplies of each APD is set to result in the same gain provided by both APD's, thereby balancing the output of the APD's. Then, the variable wave plate is adjusted until the current output of both ADP's is the same, thereby balancing the optical path. The variable gain can also be used for improved imaging. For example, when the image scan goes from a relatively dark area to a relatively bright area, the gain of the APD's may be reduced so as not to saturate the image. Conversely, when moving from a bright area to a dark area, the gain may be increased to provide improved contrast and detail.

Figure 14:
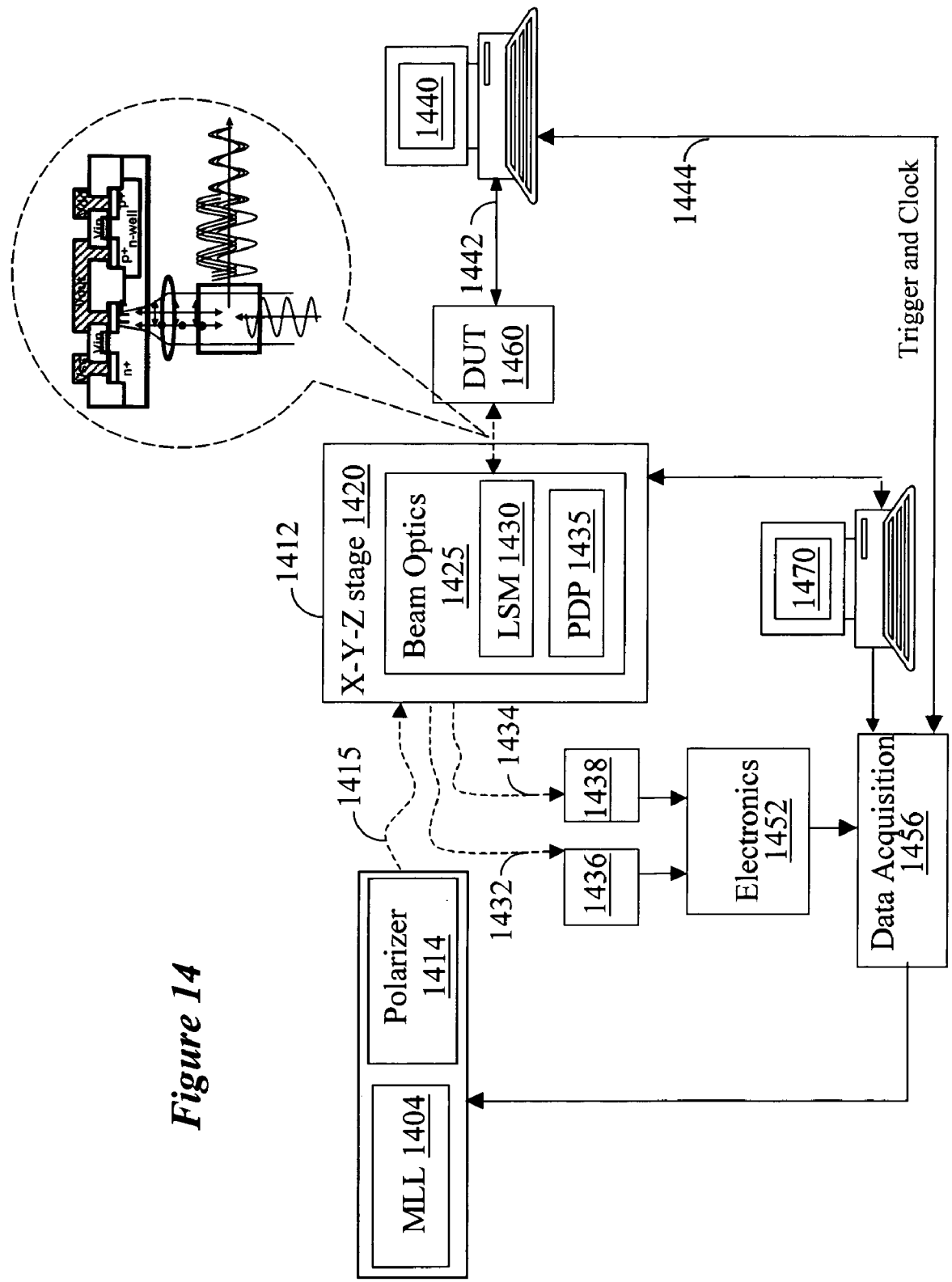
FIG. 14 depicts another embodiment of the inventive system, utilizing the PDP optics with a Mode-Locked Laser source.

FIG. 14 depicts another embodiment of the inventive system, utilizing the PDP optics with a Mode-Locked Laser source. Notably, the embodiment of FIG. 14 utilizes the conventional mode-locked laser arrangement, but incorporates the inventive common-path PDP optics. As is shown, the beam from a mode-locked laser MLL 1404 is passed through a polarizer 1414 and is then applied to the beam optics 1425. The beam optics 1425 include LSM 1430 for scanning and navigation of the beam, and common-path PDP optics 1435 for interferometric probing of the DUT 1460. The remaining elements can be any elements as described herein, such as ATE 1440 providing test signals 1442 and trigger signal 1444, APD's 1432 and 1434, receiver electronics 1452 and data acquisition system 1456. By using a mode-locked laser, an invasive wavelength, such as 1064 nm can be advantageously used, as the transistor gets to recover between the pulses. Of course, non-invasive wavelengths, or a combination of invasive and non-invasive wavelengths may also be used.

Figure 15:
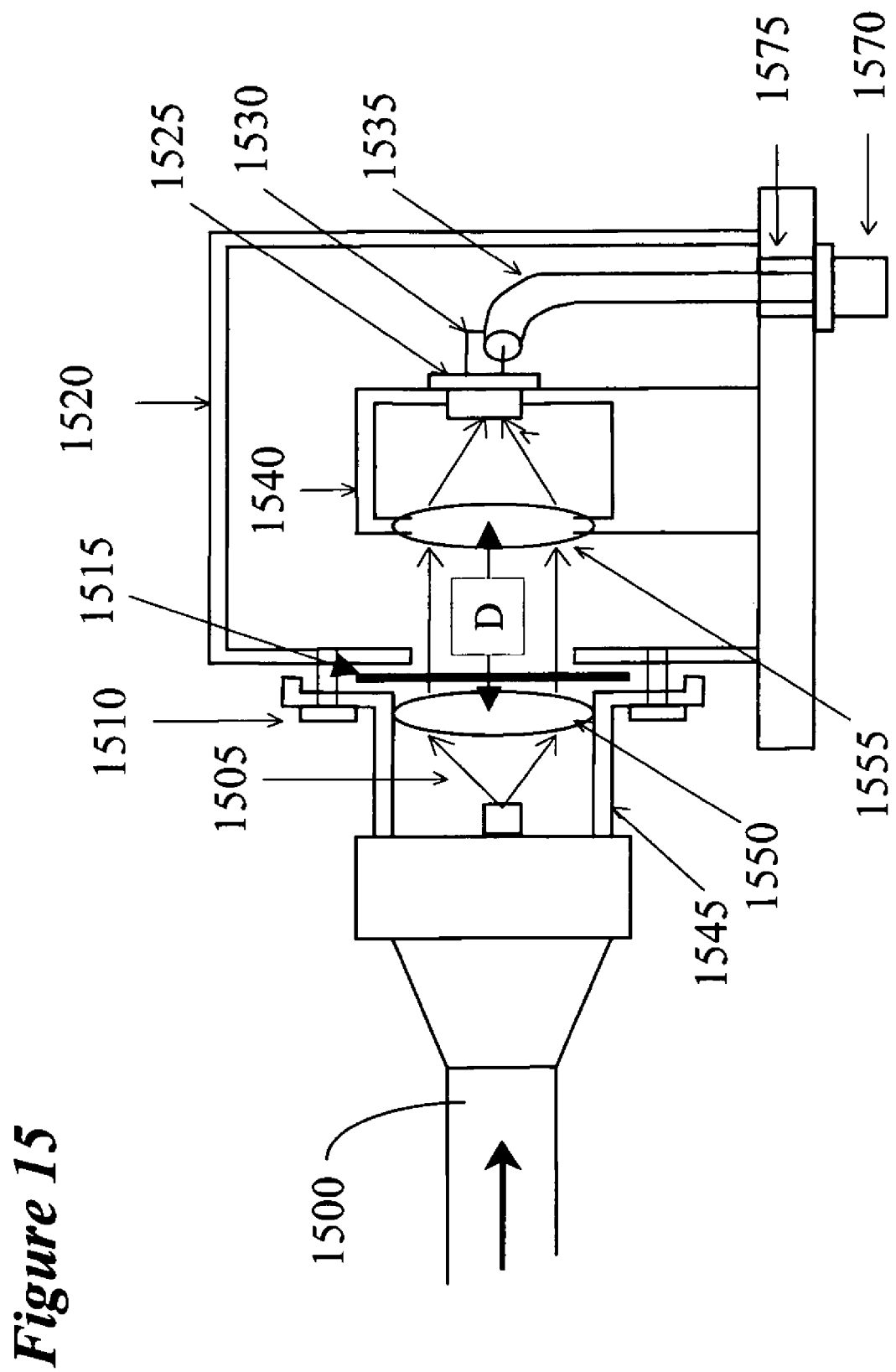
FIG. 15 depicts a fiber to photodetector coupling embodiment that enables tuning the two path lengths.

As can be understood from the above description, the common-path PDP optics provides a reference and probing optical paths that are inherently of the same length. However, when two detectors are used for differential probing, some path length difference may be introduced by the fiber optics and the other optical elements. FIG. 15 depicts a fiber to photodetector coupling embodiment that enables tuning for matching the two optical path lengths. In FIG. 15, a multimode fiber 1500 is coupled to the photodetector chamber 1520 via beam collimator module 1545. The photodetector chamber 1520 houses a photodetector holder 1540, upon which a focusing lens 1555 and an APD 1525 are mounted. A coaxial cable 1535 is connected to the photodetector leads 1530 and to an SMA connector 1570, through a ceramic feed-through 1575.

The fiber collimator module includes a collimator lens 1550, which receives the fiber output beam 1505 and collimates it. The collimated light is directed towards the focusing lens 1555 using x-y alignment screws 1510. Since the light between the collimating lens 1550 and focusing lens 1555 is collimated, changing the separation between these lenses, i.e., distance D, will not cause degradation or changes in the optical signal. Therefore, changing this distance, e.g., by alignment screws 1510, enables matching the optical path of each beam to balance the reference and probing beams. An alignment O-ring 1515 assists in maintaining the fiber collimator module in the tuned position once balance is achieved.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. A system for testing an integrated circuit microchip including a plurality of devices using laser probing, comprising:

a laser source providing a laser beam;

a beam optics wherein the beam optics comprises a Faraday rotator that rotates a polarization direction of an incident beam to define a rotated beam, the rotated beam comprising two mutually orthogonally polarized components that are aligned respectively with a length direction and a width direction of a device located at a selected spot, and a variable retarder having a fast axis and a slow axis, the fast and slow axes aligned with respective ones of the two mutually orthogonally polarized components, the variable retarder phase shifting one beam component relative to the other beam component, and an objective lens to direct the beam to the selected spot;

a first photodetector receiving reflected laser light that is reflected from said microchip and providing an electrical signal;

collection electronics receiving the electrical signal from said first photodetector and providing an output signal; and an analysis system receiving and analyzing said output signal.

2. The system of claim 1, wherein said laser source is a CW laser.

3. The system of claim 1, wherein said laser source is a pulsed laser.

4. The system of claim 1, further comprising a second photodetector, and wherein said first photodetector receives part of said reflected laser light and the second photodetector receives the remaining part of said reflected laser light.

5. The system of claim 1, wherein said beam optics further comprises a polarizing beam splitter positioned between said Faraday rotator and said variable retarder, wherein the polarizing beam splitter transmits the rotated beam.

6. The system of claim 5, further comprising a second photodetector, wherein said first photodetector receives part of said reflected laser light and the second photodetector receives the remaining part of said reflected laser light, and wherein said first photodetector and said second photodetector comprise a first and second avalanche photodiodes (APD).

7. The system of claim 6, wherein said collection electronics comprises a differential amplifier.

8. The system of claim 6, wherein said collection electronics comprises a balanced receiver.

9. The system of claim 6, wherein said analysis system comprises an oscilloscope.

10. The system of claim 6, wherein said analysis system comprises a spectrum analyzer.

11. The system of claim 6, wherein said laser source is a CW laser.

12. The system of claim 11, wherein said beam optics further comprises a first polarizing beam splitter positioned upstream of said Faraday rotator.

13. The system of claim 12, wherein said beam optics further comprises an objective lens.

14. The system of claim 13, wherein said beam optics further comprises a solid immersion lens in between the objective lens and the microchip.

15. The system of claim 13, wherein said beam optics comprises a beam pointing optics including a beam scanning mechanism.

16. The system of claim 15, wherein said beam pointing optics and said beam scanning mechanism comprise laser scanning microscope.

17. The system of claim 16, wherein said first and second APDs are coupled to a controllable variable power supply.

18. The system of claim 17, further comprising a first and second current monitors coupled to said first and second APDs, respectively.

19. The system of claim 18, further comprising a video amplifier coupled to at least one of said first and second APDs.

20. The system of claim 19, further comprising a signal amplifier system coupled to said first and second APDs and providing an amplified electrical signal corresponding to output signals of said first and second APDs.

21. The system of claim 6, further comprising a signal amplifier system coupled to said first and second avalanche photodiodes APDs and providing an amplified electrical signal corresponding to output signals of said first and second APDs.

22. The system of claim 21, wherein said signal amplifier system comprises a differential amplifier.

23. The system of claim 21, wherein said signal amplifier system comprises a first amplifier coupled to said first APD and a second amplifier coupled to said second APD.

24. The system of claim 12, further comprising: a monitoring photodetector; a second polarizing beam splitter positioned downstream of said laser light source between the first polarlizing beam splitter and the Faraday rotator, and deflecting part of said laser beam towards said monitoring photodetector; and, wherein the output of said monitoring photodetector is used to monitor the performance of said laser source.

25. The system of claim 24, further comprising a controller coupled to said variable retarder, wherein said controller varies the setting of said variable retarder to control the intensity of light received by the first and second photodetectors.

26. The system of claim 24, further comprising a variable power supply coupled to said first and second photodetectors, wherein varying the settings of said power supply controls the gain of said first and second photodetectors.

27. The system of claim 1, further comprising imaging optics, wherein said imaging optics establish a light path for specimen imaging and said beam optics establish a light path for specimen probing.

28. The system of claim 27, further comprising imaging light source providing imaging illumination through said imaging optics.

29. The system of claim 28, further comprising a switching element for switching between said beam optics and said imaging optics.

30. A method of probing an integrated circuit microchip, comprising:
generating a laser beam;
transferring the laser beam through a beam optics to condition the beam, the conditioned beam having two mutually orthogonally polarized components that traverse a common optical path and are aligned, respectively, with a length direction and a width direction of a device included in the microchip, and are phase shifted relative to one another;
pointing the two mutually orthogonally polarized components at a common selected area on the microchip including the device; and
collecting and analyzing reflected light that is reflected from the selected area.

31. The method of claim 30, further comprising dividing the reflected light into a first reflection and a second reflection.

32. The method of claim 31, wherein said collecting comprises directing the first reflection onto a first photodetector and directing the second reflection onto a second photodetector.

33. The method of claim 32, further comprising applying output signals of said first and second photodetectors to a balanced receiver and obtaining a differential signal therefrom.

34. The method of claim 33, further comprising applying the differential signal onto an oscilloscope.

35. The method of claim 32, further comprising applying a variable power to said first and second photodetectors, and varying the power so as to balance said first and second photodetectors.

36. The method of claim 30, wherein said generating a laser beam comprises generating a CW laser beam.

37. The method of claim 36, wherein said analyzing comprises scanning said CW Laser beam over an area of said microchip so as to obtain an image of said area.

38. The method of claim 37, further comprising varying the phase shifting so as to control image intensity when said area includes high and low reflectance parts.

39. The method of claim 37, wherein said collecting comprises directing the reflected light onto a first and a second photodetectors.

40. The method of claim 39, further comprising balancing the first and second photodetectors by applying a variable power supply to said first and second photodetectors and varying the power applied to said first and second photodetectors so as to balance said first and second photodetectors.

41. The method of claim 30, further comprising illuminating a selected area of said microchip through an imaging path and obtaining an image of said selected area.

42. The method of claim 41, wherein said collecting comprises directing the reflected light onto at least one probing photodetector, and said obtaining an image comprises directing the reflected light onto an imaging photodetector.

43. An optical system comprising:
a laser source providing a laser beam;

a polarizer polarizing said laser beam;

a Faraday rotator rotating the laser beam, such that a first polarization vector of a first beam component and a second polarization vector of a second beam component of the beam are configured to be aligned, respectively, with a length direction and a width direction of a device;

an optical retarder phase shifting the first beam component and second beam component relative to one another, wherein the optical retarder is positioned between the Faraday rotator and an objective lens directing said beams directly onto a selected spot including said device;

wherein said polarizer, Faraday rotator, optical retarder and objective lens define a beam path, said beam path further comprising a first beam splitter receiving a reflected beam reflected from said device and directing part of said reflected beam out of said beam path; and a first photodetector receiving said reflected beam from the first beam splitter.

44. The optical system of claim 43, wherein said beam path further comprises a second beam splitter directing the remainder of said reflected beam out of said beam path, after reflection by said first beam splitter.

45. The optical system of claim 44, further comprising a second photodetector receiving said reflected beam from said second beam splitter.

46. The optical system of claim 45, further comprising a receiver receiving output signals from said first and second photosensors and providing a differential signal therefrom.

47. The optical system of claim 46, further comprising a first amplifier coupled between said first photosensor and said receiver, and a second amplifier coupled between said second photosensor and said receiver.

48. The optical system of claim 45, wherein said laser source comprises a CW laser source.

49. The optical system of claim 48, further comprising a laser-monitoring module monitoring said laser beam.

50. The optical system of claim 49, wherein said laser-monitoring module comprises a third photodetector and a third beam splitter directing part of said laser beam onto said third photodetector.

51. The optical system of claim 43, wherein said laser source is a CW laser source.

52. The optical system of claim 43, wherein said laser source is a pulsed laser source.

53. The optical system of claim 43, wherein said optical retarder is a variable retarder having its fast and slow axis aligned respectively with the first polarization direction and the second polarization direction.

54. The optical system of claim 45, further comprising an optical amplifier receiving said reflected beam from said first and second beam splitters and directing said reflected beam to said first and second photodetectors.

55. The method of claim 30, wherein the method further comprises:

phase shifting one of the two mutually orthogonally polarized components of the rotated beam.

* * * * *